United States Patent [19]
Hasebe et al.

[11] Patent Number: 6,033,475
[45] Date of Patent: *Mar. 7, 2000

[54] RESIST PROCESSING APPARATUS

[75] Inventors: Keizo Hasebe, Kofu; Hiroyuki Iino, Suita; Norio Semba, Kumamoto; Yoshio Kimura, Kumamoto-ken, all of Japan

[73] Assignee: Tokyo Electron Limited, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/579,845

[22] Filed: Dec. 26, 1995

[30] Foreign Application Priority Data

Dec. 27, 1994 [JP] Japan .................................. 6-324362
Apr. 19, 1995 [JP] Japan .................................. 7-119334

[51] Int. Cl.$^7$ .................................................. B01D 19/00
[52] U.S. Cl. .................................. 118/320; 95/47; 96/6; 96/8; 96/10
[58] Field of Search ................... 95/46, 47; 96/6, 96/8, 10; 437/225, 231; 438/478, 694, 745, 758; 118/320, 410, 416, DIG. 4

[56] References Cited

U.S. PATENT DOCUMENTS

| | | | |
|---|---|---|---|
| 4,622,239 | 11/1986 | Schoenthaler et al. ................. | 118/410 |
| 4,787,921 | 11/1988 | Shibata et al. ................. | 96/6 |
| 5,019,140 | 5/1991 | Bowser et al. ................. | 96/6 |
| 5,134,962 | 8/1992 | Amada et al. ................. | 118/320 |
| 5,374,312 | 12/1994 | Hasebe et al. ................. | 118/320 |
| 5,425,803 | 6/1995 | van Schravendijk et al. ............. | 95/46 |

FOREIGN PATENT DOCUMENTS

| | | | |
|---|---|---|---|
| 3822093 | 1/1989 | Germany ................. | 95/46 |
| 61-259523 | 11/1986 | Japan . | |
| 62-37923 | 2/1987 | Japan . | |
| 62-42708 | 2/1987 | Japan ................. | 96/6 |
| 63-91105 | 4/1988 | Japan ................. | 95/46 |
| 64-7916 | 1/1989 | Japan ................. | 95/46 |
| 1-215312 | 9/1989 | Japan ................. | 95/46 |
| 1-270909 | 10/1989 | Japan ................. | 96/6 |
| 2-31785 | 8/1990 | Japan . | |
| 2-290201 | 11/1990 | Japan ................. | 95/46 |
| 5-177104 | 7/1993 | Japan ................. | 95/46 |
| 5-32162 | 8/1993 | Japan . | |

*Primary Examiner*—C. Scott Bushey
*Attorney, Agent, or Firm*—Oblon, Spivak, McClelland, Maier & Neustadt, P.C.

[57] ABSTRACT

The present invention has a resist processing apparatus for supplying a processing solution onto an object to be processed to perform a resist process, including a processing solution supply nozzle for supplying the processing solution onto the object to be processed, a processing solution feeding arrangement for feeding the processing solution to the processing solution supply nozzle, a processing solution flow path arranged to extend between the processing solution feeding arrangement and the processing solution supply nozzle, and a processing solution deaeration mechanism arranged at an intermediate portion of the processing solution flow path to deaerate the processing solution. The processing solution deaeration mechanism includes a closed vessel, an inlet port for introducing the processing solution into the closed vessel, a member arranged in the closed vessel and having a gas-liquid separation function, and an evacuating arrangement for evacuating the interior of the closed vessel to deaerate the processing solution through the member having the gas-liquid separation function. Gaseous components are separated from the processing solution, and an outlet port feeds the processing solution, from which gaseous components are separated by the member having the gas-liquid separation function, to the processing solution supply nozzle.

12 Claims, 10 Drawing Sheets

RESIST PROCESSING APPARATUS

BACKGROUND OF THE INVENTION

1. Field of the Invention

The present invention relates to a resist processing apparatus and resist processing method and, more particularly, to a developing apparatus and developing method in which, e.g., a developing solution is supplied onto a photoresist layer formed on the surface of a semiconductor wafer to perform a developing process.

2. Description of the Related Art

In the manufacture of semiconductor devices, a photoresist is applied to a semiconductor wafer serving as an object to be processed. A circuit pattern is transferred on the photoresist using a photolithography technique and developed to form a circuit.

For example, in this developing process, the following system is generally employed. That is, a developing solution is supplied from a developing solution supply nozzle to a semiconductor wafer serving as an object. The developing solution is held by its surface tension in a swelled manner for a predetermined period of time to develop a circuit pattern.

In recent years, from the viewpoint of uniformly supplying a developing solution, a paddle type system is employed as this general system. In this paddle type system, for example, a developing solution supply nozzle having a large number of nozzle holes aligned in a line is used. A developing solution is supplied from this nozzle, while a semiconductor wafer is rotated at a low speed to spread the developing solution on the entire semiconductor wafer.

In the use of such a system, a method of feeding a developing solution in a tank with nitrogen gas to the nozzle under pressure is employed. This method has the problem of bubble formation in swelling the developing solution on a semiconductor wafer. The presence of bubbles generates a portion where the developing solution is not supplied, undesirably generating a non-developed portion.

To solve this problem, a method of deaerating a developing solution in a vacuum (Jpn. UM Appln. KOKAI Publication No. 62-37923), and a method of removing bubbles in a developing solution using a foam breaker (Jpn. Pat. Appln. KOKAI Publication No. 61-259523) have been proposed.

In the above method of deaerating a developing solution in a vacuum which is disclosed in Jpn. UM Appln. KOKAI Publication No. 62-37923, the concentration of the developing solution undesirably changes upon evaporation of water in the developing solution. In addition, with recent micropatterning of circuit patterns, some resists have higher performance, i.e., higher resolution. Even small bubbles which have not posed any problem cause a developing error with such resists. Once formed, small bubbles cannot be sufficiently removed by the conventional deaeration methods.

SUMMARY OF THE INVENTION

The present invention has been made in consideration of the above situation, and has as its object to provide a resist processing apparatus and resist processing method in which bubbles in a processing solution can be removed without changing the concentration of the processing solution. The bubbles means gases in the processing solution and gases in a pipe in which the processing solution flows. The resist means a resist coating process and a developing process.

It is another object of the present invention to provide a resist processing apparatus and resist processing method in which bubbles in a processing solution can be removed without changing the concentration of the processing solution, and a resist process can be performed with a high precision without forming small bubbles which will pose a problem in resist processing a high-resolution resist.

According to the present invention, there is provided a resist processing apparatus for supplying a processing solution onto an object to perform a resist process, comprising a processing solution supply nozzle for supplying the processing solution onto the object, processing solution feeding means for feeding the processing solution to the processing solution supply nozzle, a processing solution flow path arranged between the processing solution feeding means and the processing solution supply nozzle, and a processing solution deaeration mechanism arranged at an intermediate portion of the processing solution flow path to deaerate the processing solution, in which the processing solution deaeration mechanism comprises a closed vessel, an inlet port for introducing the processing solution into the closed vessel, a member arranged in the closed vessel and having a gas-liquid separation function, evacuating means for evacuating an interior of the closed vessel to deaerate the processing solution through the member having the gas-liquid separation function, thereby separating gaseous components from the processing solution, and an outlet port for feeding the processing solution, from which gaseous components are separated by the member having the gas-liquid separation function, to the processing solution supply nozzle.

In the present invention, the processing solution deaeration mechanism may comprise a closed vessel, an inlet port for introducing the processing solution into the closed vessel, an outlet port for feeding the processing solution from the closed vessel toward the processing solution supply nozzle, a plurality of tubular members arranged to extend from the inlet port to the outlet port in the closed vessel and each passing the processing solution therethrough to attain a gas-liquid separation function, and evacuating means for evacuating an interior of the closed vessel to deaerate the processing solution flowing through the plurality of tubular members through wall portions of the plurality of tubular members, thereby separating gaseous components from the processing solution, wherein the processing solution from which gaseous components are separated is fed from the outlet port.

In addition, in the present invention, the processing solution deaeration mechanism may be constituted by arranging three tubes, i.e., a first tube made of a porous material and having the smallest diameter (e.g., made of polytetrafluoroethylene and having an average hole diameter of 0.2 to 0.8 μm), a second tube having a middle diameter, and a third tube made of a non-porous material and having the largest diameter. Inner evacuation means are arranged inside the first tube, and outer evacuation means are arranged between the second and third tubes. A liquid flows through a path formed between the first and second tubes.

According to the present invention, there is provided a resist processing method of supplying a processing solution onto an object to perform a resist process, comprising the step of deaerating the processing solution through a member having a gas-liquid separation function to separate gaseous components from the processing solution, the step of feeding the processing solution, from which gaseous components are separated by the member having the gas-liquid separation function, to a processing solution supply nozzle, and the step of supplying the processing solution from the processing solution supply nozzle onto the object.

According to the present invention, there is provided a resist processing method of supplying a processing solution onto an object to perform a resist process, comprising the step of passing the processing solution through a plurality of tubular members each having a gas-liquid separation function, the step of deaerating the processing solution flowing through the tubular members through wall portions of the tubular members to separate gaseous components from the processing solution, the step of feeding the processing solution, from which gaseous components are separated by the tubular members, to a processing solution supply nozzle, and the step of supplying the processing solution from the processing solution supply nozzle onto the object.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

According to the resist processing apparatus and resist processing method of the present invention, since a processing solution is deaerated through a member having a gas-liquid separation function, only gaseous components in the processing solution are separated without discharging or removing the processing solution itself. Therefore, bubbles in the processing solution can be removed without changing the concentration of the processing solution.

In addition, according to the resist processing apparatus and resist processing method of the present invention, a processing solution is passed through a plurality of tubular members each having a gas-liquid separation function. Gaseous components are separated from the processing solution by deaerating the processing solution through the wall portions of the tubular members. With this arrangement, the surface area for removing gaseous components becomes larger, and only gaseous components can be more efficiently removed from the processing solution. Therefore, bubbles in the processing solution can be removed without changing the concentration of the processing solution. At the same time, a resist process can be performed with a high precision without forming small bubbles which will pose a problem in resist processing a high-resolution resist. More specifically, in the conventional method of deaerating a processing solution simply in a vacuum, the inside of the processing solution is not completely deaerated. Residual gaseous components in the processing solution form small bubbles in dropping the processing solution onto an object. The small bubbles remain attached to the object. Also in the method of eliminating bubbles in a processing solution using a foam breaker, the processing solution cannot be completely deaerated, and residual gaseous components form small bubbles. In the present invention, however, only gaseous components can be efficiently removed through a plurality of tubular members each having a gas-liquid separation function. Therefore, formation of small bubbles can be substantially completely prevented without changing the concentration of a processing solution.

In addition, if a processing solution deaeration mechanism is constituted by a porous tube having a triple structure in the resist processing apparatus of the present invention, a processing solution flows through a space between the tubes of the porous tube. Since the processing solution can be simultaneously deaerated from the inside and outside of the middle tube, deaeration can be performed with a high efficiency even in a single tube having a short path. As a result, the deaeration mechanism can be decreased in size, and the processing uniformity can be realized to improve the yield.

The first tube (innermost layer) and the second tube (middle layer) of the porous tube having the triple structure have bellows-like structures. With these structures, the contact area of the processing solution with the deaeration tube can be increased to further increase the deaeration efficiency. At this time, the first and second tubes are arranged such that a section, in a substantially horizontal direction, of a solution flow path, i.e., that of a deaeration path has substantially the same area, that is, the pitches of the crests and roots of the respective bellows-like structures correspond to each other. With this arrangement, a stable flow path is ensured, that is, disturbances to the flow rate can be prevented to stably supply the developing solution.

A porous polytetrafluoroethylene tube having an average hole diameter of 0.2 to 0.8 μm has excellent resistance to liquid pressure. If this porous tube is used as the first and second tubes, the liquid ratio a different in pressure between liquid side and vacuum side separated by a deaerating film can be increased to increase the deaeration efficiency.

Preferred embodiments of the present invention will be described below in detail with reference to the accompanying drawings.

Figure 1:
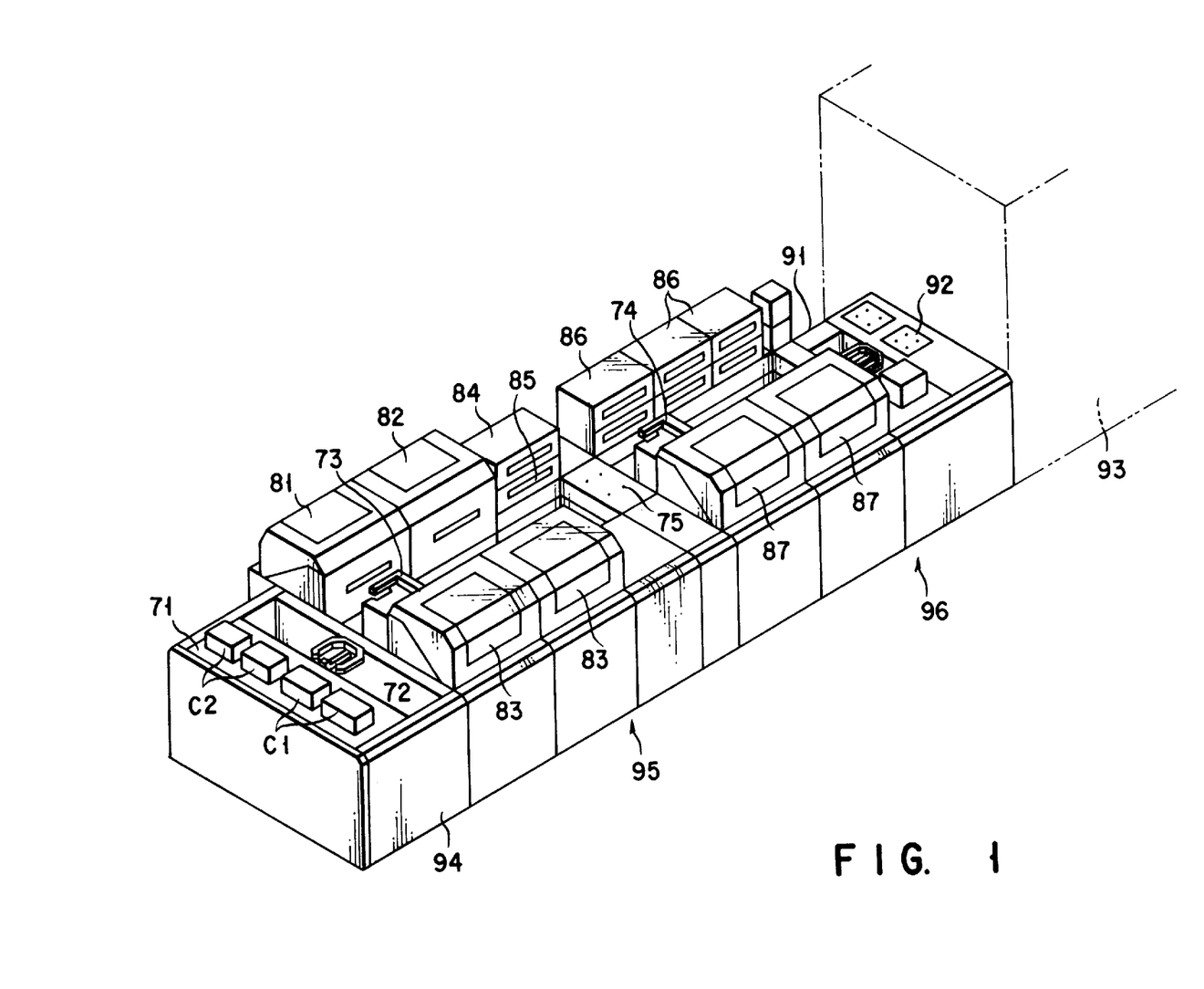
FIG. 1 is a schematic view showing a coating/developing apparatus in which a developing apparatus of the present invention is incorporated.

FIG. 1 is a schematic view showing a substrate coating/developing apparatus in which the developing apparatus of the present invention is incorporated. This coating/developing apparatus is mainly constituted by a load/unload section 94, a first processing section 95, a second processing section 96, and an exposure unit 93. Reference numeral 71 in FIG. 1 denotes a carrier stage in the load/unload section 94. Carrier cassettes C1 for storing a plurality of substrates as objects, and carrier cassettes C2 for storing processed substrates are mounted on the carrier stage 71. A pair of handlers 72 for loading/unloading substrates from the opening portions of the carrier cassettes C1 and C2 is mounted on the load/unload section 94. Main arms 73 and 74 for conveying substrates are arranged at the central portions of the first and second processing sections, respectively. A transfer table 75 is mounted between the first and second processing section 95 and 96.

A brush cleaning unit 81, a jet-water cleaning section 82, coating units 83, an adhesion section 84, and a cooling section 85 are arranged on both the sides of the convey path of the main arm 73. Heating sections 86 and developing sections 87 are arranged on both the sides of the convey path of the main arm 74. A pair of handlers 91 and a transfer table 92 are arranged between the second processing section 96 and the exposure unit 93.

In the coating/developing apparatus having the above arrangement, a substrate to be processed which is stored in the cassette C1 is extracted by the pair of handlers 72. Then, the substrate is transferred to the main arm 73 and conveyed into the brush cleaning unit 81. The substrate cleaned with a brush in the brush cleaning unit 81 is cleaned with high-pressure jet water in the jet-water cleaning section 82, as needed. The substrate is subjected to a hydrophobical treatment in the adhesion section 84 and cooled in the cooling section 85. Thereafter, a photoresist film, i.e., a photosensitive film is formed on the substrate in the coating unit 83. The obtained substrate is subjected to exposure processing in the exposure unit 93 to have a predetermined pattern transferred on the photoresist film. The exposed substrate is conveyed into the developing section 87. After the predetermined pattern is developed using a developing solution deaerated by a processing solution deaeration mechanism 300, the developing solution is washed away with a rinse solution to complete the developing process.

Figures 2, 3:
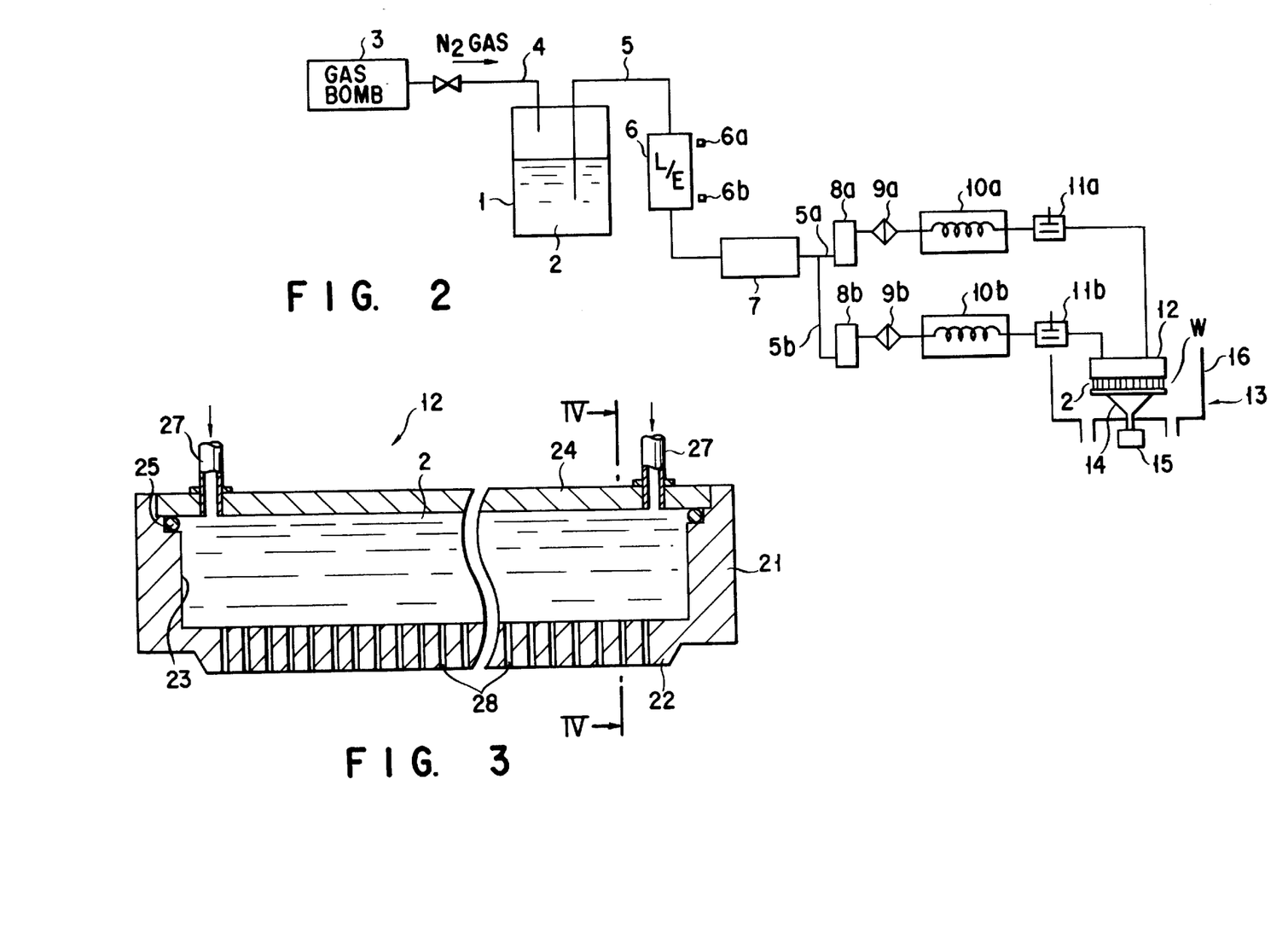
FIGS. 2 and 8 are block diagrams each showing a developing apparatus of the present invention.
FIG. 3 is a sectional view showing the structure of a nozzle used in the developing apparatus shown in FIG. 2.

FIG. 2 is a block diagram showing a developing apparatus according an embodiment of the present invention. Reference numeral 1 in FIG. 2 denotes a tank. A developing solution 2 is contained in the tank 1. A gas bomb 3 for containing a pressurized gas such as nitrogen gas is connected to the tank 1 through a pipe 4. The end portion of a pipe 5 is dipped in the developing solution 2 in the tank 1. A middle tank 6 and a processing solution deaeration mechanism 7 are sequentially arranged at intermediate portions of the pipe 5. When the pressurized gas, e.g., nitrogen gas, in the gas bomb 3 is supplied to the tank 1 through the pipe 4, the developing solution 2 in the tank 1 is fed under pressure toward a nozzle 12 through the pipe 5.

The pipe 5 is divided into pipes 5a and 5b on the downstream side of the processing solution deaeration mechanism 7. Flow meters 8a and 8b, filters 9a and 9b, water jackets 10a and 10b, and air-operation valves 11a and 11b are sequentially arranged between the corresponding pipes and the nozzle 12. A developing solution is introduced from two portions into the nozzle 12 through the two pipes.

On the other hand, a developing section 13 comprises a chuck 14 for chucking a substrate, e.g., a semiconductor wafer W, by vacuum suction, a motor 15 for rotating the chuck 14, and a cup 16 surrounding the semiconductor wafer W held by the chuck 14.

A limit sensor 6a and an empty sensor 6b which are formed of, e.g., electrostatic capacity sensors are arranged outside the middle tank 6. Signals from these sensors are output to a controller (not shown) to control the liquid level of the developing solution. The flow rate of the developing solution 2 flowing through the pipes 5a and 5b is controlled by the flow meters 8a and 8b. Any impurities and the like are removed from the developing solution 2 by the filters 9a and 9b. Temperature-adjusted water is circulated through the water jackets 10a and 10b to control the temperature of the developing solution 2 flowing through the pipes 5a and 5b.

The developing solution 2 treated in this manner is fed to the nozzle 12 and supplied from the nozzle 12 onto the semiconductor wafer W on the chuck 14 to perform a developing process.

Figures 4, 5:
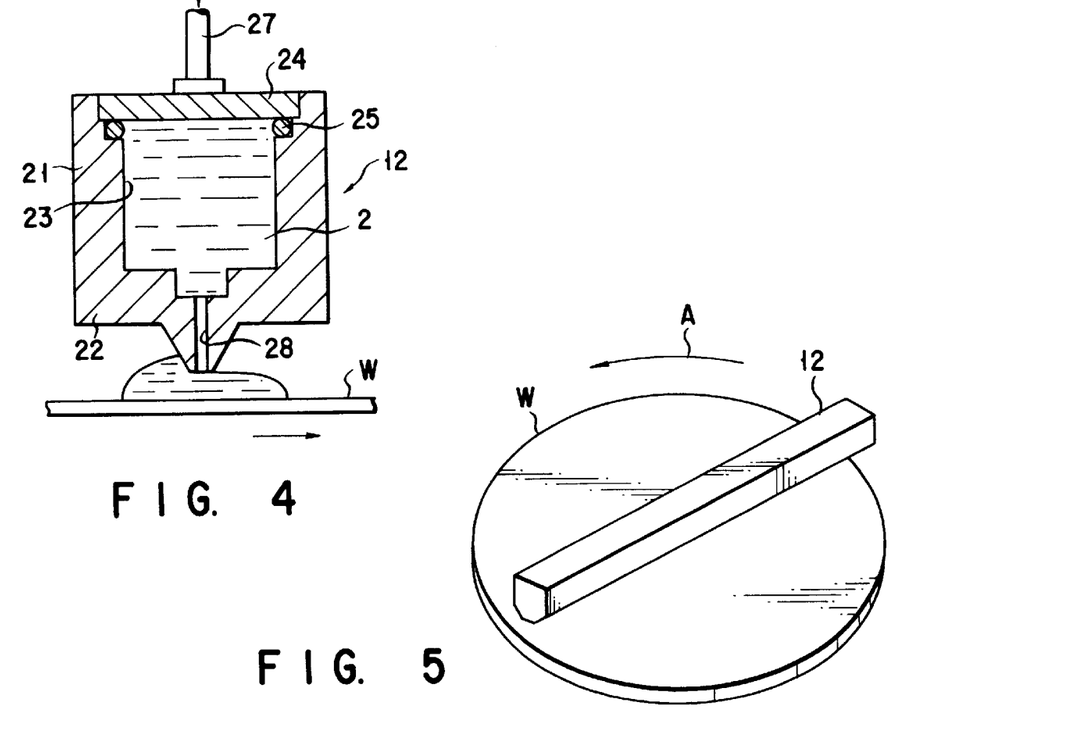
FIG. 4 is a sectional view of the nozzle in FIG. 3 taken along the line IV—IV therein.
FIG. 5 is a view for explaining the developing solution supply operation of the nozzle.

Next, the nozzle 12 will be described. As shown in FIG. 3, and FIG. 4 as a sectional view taken along the line IV—IV in FIG. 3, the nozzle 12 has a developing solution container 23 defined by a side wall 21 and a bottom wall 22. The upper opening of the container 23 is closed with a lid member 24. A portion between the lid member 24 and the side wall 21 is sealed with a packing 25. Two developing solution supply ports 27 are formed in the lid member 24. The developing solution 2 fed through the pipes 5a and 5b is supplied to and contained in the developing solution container 23 through the two supply ports 27. A plurality of liquid ejection holes 28 are formed in the bottom wall 22 to extend in its longitudinal direction. The developing solution 2 is supplied from the liquid ejection holes 28 onto the semiconductor wafer W. The length of the nozzle 12 in the horizontal direction is almost equal to the diameter of the semiconductor wafer W.

When the developing solution 2 is actually supplied from the nozzle 12 onto the semiconductor wafer W, the nozzle 12 is located above the center of the wafer W, as shown in FIG. 5. While the developing solution is ejected from the liquid ejection holes 28 onto the semiconductor wafer W, the semiconductor wafer W is rotated a ½ turn by the motor 15. With this operation, the developing solution 2 swells to a predetermined thickness on the semiconductor wafer W.

Note that it is preferable to eject pure water and form a pure-water film on the photoresist film before ejecting and swelling the developing solution. By forming the pure-water film in advance, the influence of ejecting the developing solution on the photoresist film, e.g., the first impact can be reduced. As a result, defects caused by the first impact and the like can be reduced.

Figure 6:
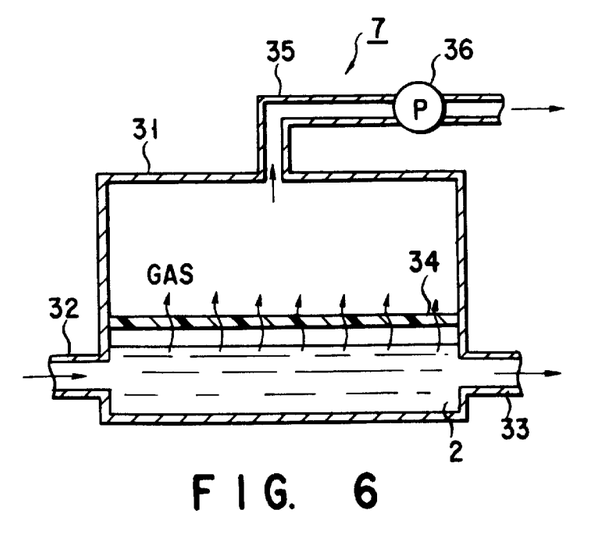
FIGS. 6 and 7 are sectional views each showing an example of a processing solution deaeration mechanism used in the developing apparatus shown in FIG. 2.

The processing solution deaeration mechanism 7 will be described below. FIG. 6 is a sectional view showing an example of the processing solution deaeration mechanism 7. The processing solution deaeration mechanism 7 comprises a closed vessel 31, an inlet port 32 for introducing the processing solution 2 into the closed vessel 31, an outlet port 33 for feeding the processing solution from the closed vessel 31, a partitioning member 34 which is arranged above the inlet port 32 and the outlet port 33 in the closed vessel 31 so as to horizontally partition the interior of the vessel, and has a gas-liquid separation function, an exhaust pipe 35 connected to the upper wall of the closed vessel, and a vacuum pump 36 for evacuating the interior of the closed vessel 31 through the exhaust pipe 35.

The partitioning member 34 having the gas-liquid separation function is a so-called non-porous member having properties of passing gases therethrough but not passing liquids, therethrough, unlike a normal porous member. As such a material, polytetrafluoroethylene (PTFE), polyethylene, polycarbonate, and the like can be employed.

When the interior of the vessel 31 is evacuated upon operation of the vacuum pump 36, the developing solution introduced from the inlet port 32 to a portion under the partitioning member 34 in the vessel 31 is deaerated through the partitioning member 34 having the gas-liquid separation function to separate gaseous components contained in the developing solution. The developing solution 2 from which gaseous components are separated is fed from the outlet port 33 toward the nozzle 12.

With this processing solution deaeration mechanism, since the developing solution is deaerated through the partitioning member 34 having the gas-liquid separation function, only gaseous components can be removed without removing the developing solution itself. Therefore, the developing solution can be deaerated without changing the concentration of the developing solution. Since no developing solution is removed in this manner, stronger vacuum deaeration can be performed, and residual gas amount can be decreased compared to the prior art to decrease the attachment rate of small bubbles to a semiconductor wafer serving as an object.

An advanced example of the processing solution deaeration mechanism will be described below with reference to FIG. 7. In this example, the processing solution deaeration mechanism comprises the closed vessel 31 having the inlet port 32 for introducing the developing solution 2 and the outlet port 33 for feeding the developing solution 2, the exhaust pipe 35, and the vacuum pump 36, like the mechanism shown in FIG. 6. In this example, the processing solution deaeration mechanism further comprises a plurality of pipe members 38 extending from the inlet port 32 to the outlet port 33 instead of the partitioning member 34. Each pipe member 38 is made of a material having a gas-liquid separation function identical to that of the above-described partitioning member 34, e.g., PTFE.

When the interior of the vessel 31 is evacuated upon operation of the vacuum pump 36, the developing solution flowing through the pipe members 38 is deaerated through the wall portions of the pipe members 38 to separate gaseous components contained in the developing solution. The developing solution 2 from which gaseous components are separated is fed from the outlet port 33 toward the nozzle 12.

With this processing solution deaeration mechanism, the developing solution is passed through the plurality of pipe members 38 each having the gas-liquid separation function. The developing solution is deaerated through the wall portions of the pipe members 38 to separate gaseous components from the processing solution. For this reason, the deaeration surface area becomes larger, and only gaseous components are more efficiently removed from the processing solution. Therefore, bubbles in the processing solution can be removed without changing the concentration of the processing solution. At the same time, a developing process can be performed with a high precision without forming small bubbles which will pose a problem in developing a high-resolution resist.

From the viewpoint of realizing these effects, it is preferable that the pipe members 38 each having the gas-liquid separation function be thinner, e.g., 1 mm in inner diameter, and the number thereof be larger, e.g., 100 or more.

Figure 11A:
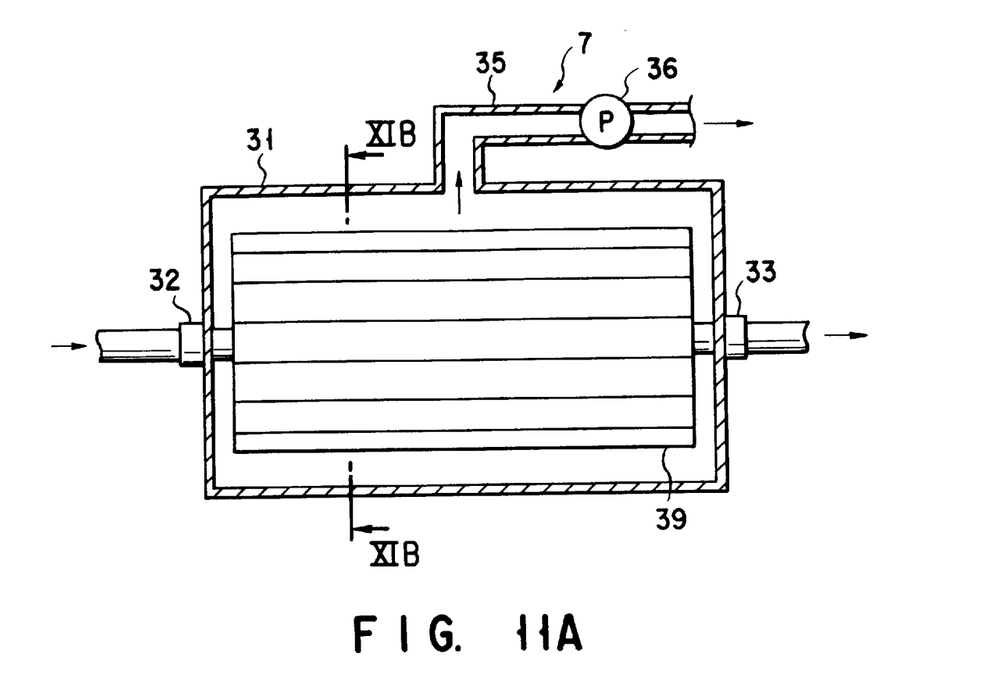
FIG. 11A is a sectional view showing another example of the processing solution deaeration mechanism used in the developing apparatus shown in FIG. 2.
Figure 11B:
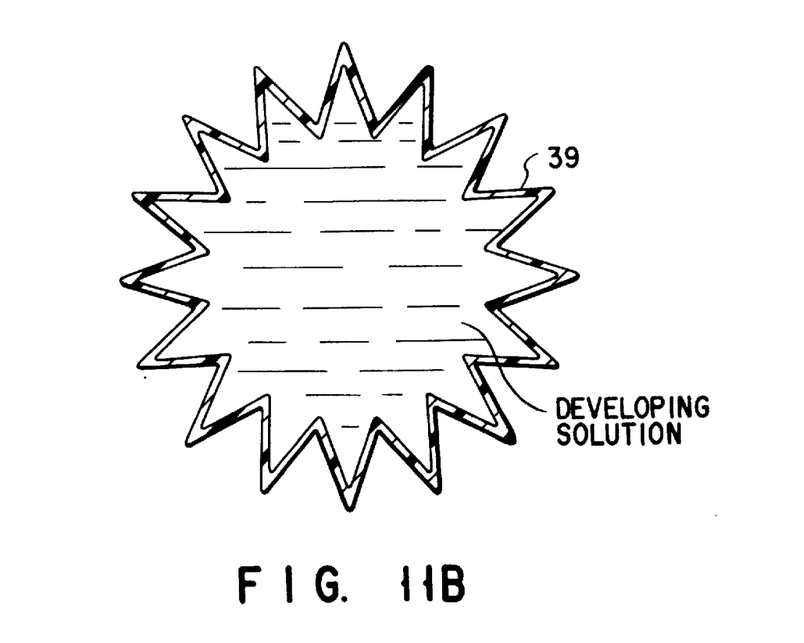
FIG. 11B is a sectional view of the processing solution deaeration mechanism in FIG. 11A taken along the line XIB—XIB therein.

A pipe member 39 shown in FIGS. 11A and 11B may be used. More specifically, an example of the processing solution deaeration mechanism shown in FIGS. 11A and 11B comprises the pipe member 39 extending from the inlet port 32 to the outlet port 33 and having a plurality of projecting portions in a section, instead of the partitioning member 34.

The pipe member 39 is made of a material having a gas-liquid separation function identical to that of the above-described partitioning member 34, e.g., a porous PTFE member. With this arrangement, the area of the deaerating film is increased remarkably, the gasous component is removed at high efficiently.

Note that any one of the processing solution deaeration mechanisms shown in FIG. 6, FIG. 7, and FIGS. 11A and 11B can efficiently remove other impurity gases except for the pressurized gas. Therefore, an undesirable reaction can be prevented to prevent gelation and the like.

Figure 7:
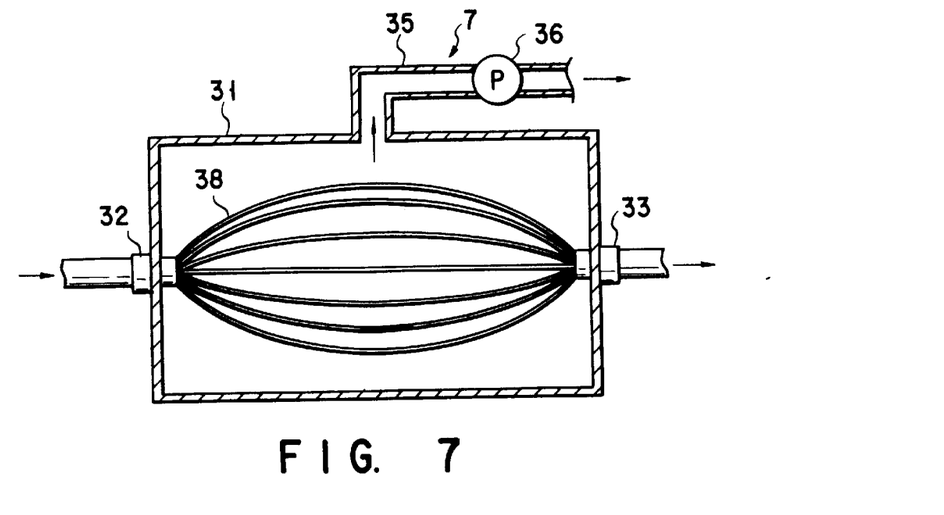

A developing process was performed on 8" wafers coated with a high-resolution resist by using the developing apparatus having the processing solution deaeration mechanism shown in FIG. 7. As a result of observation of developing defects, in the case of the conventional apparatus, several tens developing defects were observed around a portion on the wafer corresponding to the first position of a nozzle. To the contrary, in the case of the developing apparatus having the deaeration mechanism in FIG. 7 in this embodiment, no developing defect was observed. From these results, the effect of the present invention was confirmed.

Figure 8:
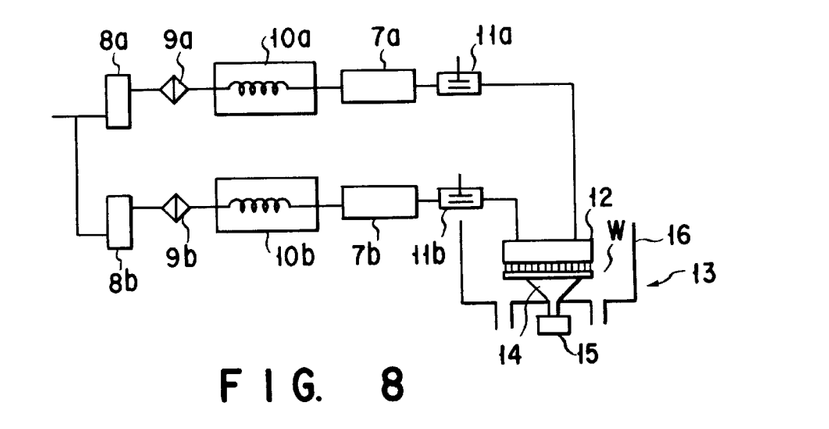

Note that the processing solution deaeration mechanism is arranged between the middle tank 6 and the flow meters 8a and 8b in this embodiment, but the position of the processing solution deaeration mechanism is not limited to this. For example, as shown in FIG. 8, processing solution deaeration mechanisms (denoted by reference numerals 7a and 7b in FIG. 8) may be arranged on the downstream sides of the filters 9a and 9b, e.g., between the water jackets 10a and 10b and the air-operation valves 11a and 11b, respectively. By arranging the processing solution deaeration mechanisms on the downstream sides of the filters in this manner, large bubbles can be trapped when a processing solution passes through the filters. The deaeration ability is expected to improve in this case.

Figure 9:
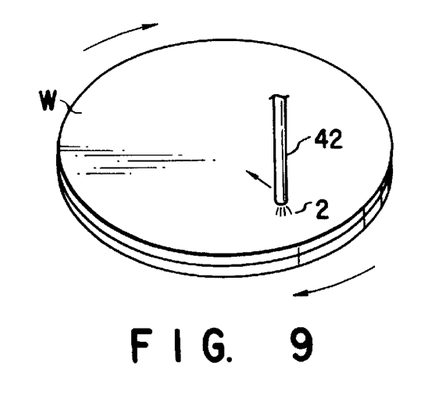
FIGS. 9 and 10 are views each showing another example of the nozzle used in the developing apparatus of the present invention.
Figure 10:
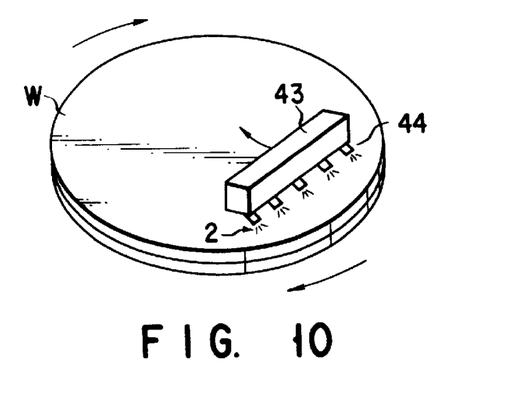

In addition, the nozzle is not limited to the above structure. A stream nozzle 42 as shown in FIG. 9, or a multi-nozzle obtained by arranging a plurality of nozzles 44 on a nozzle main body 43 as shown in FIG. 10 may be used. In these structures, each nozzle is linearly moved while rotating the semiconductor wafer W as an object.

Assume that the stream nozzle or the multi-nozzle is used. In the conventional developing apparatus, small bubbles are easily formed. However, by using the processing solution deaeration mechanism of the present invention, formation of small bubbles can be almost completely prevented. When a high-resolution resist is developed, developing defects can be practically eliminated.

When a high-resolution resist on a wafer was developed by the conventional developing apparatus using a stream nozzle, several hundreds developing defects were observed. To the contrary, when a resist was developed by the developing apparatus employing the deaeration mechanism in FIG. 7, no developing defect was generated. When a high-resolution resist on a wafer was developed by the conventional developing apparatus using a multi-nozzle, 10,000 or more developing defects were observed. To the contrary, when a resist was developed by the developing apparatus employing the deaeration mechanism in FIG. 7, only ten-odd number of developing defects were found.

Figure 12:
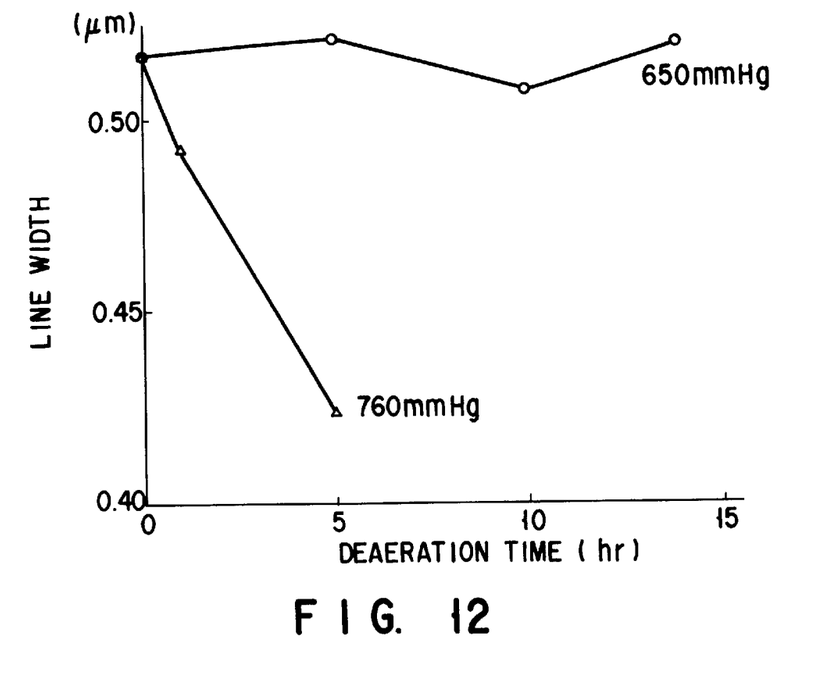
FIG. 12 is a graph showing the relationship between the line width and the deaeration time in the processing solution deaeration mechanism used in the developing apparatus of the present invention.
Figure 13:
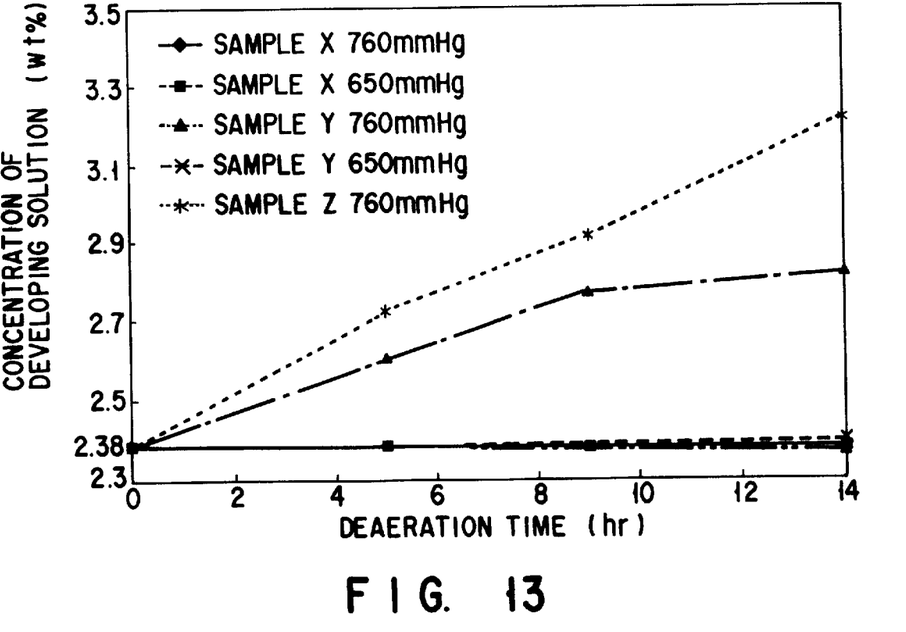
FIG. 13 is a graph showing the relationship between the concentration of a developing solution and the deaeration time in the processing solution deaeration mechanism used in the developing apparatus of the present invention.
Figure 14:
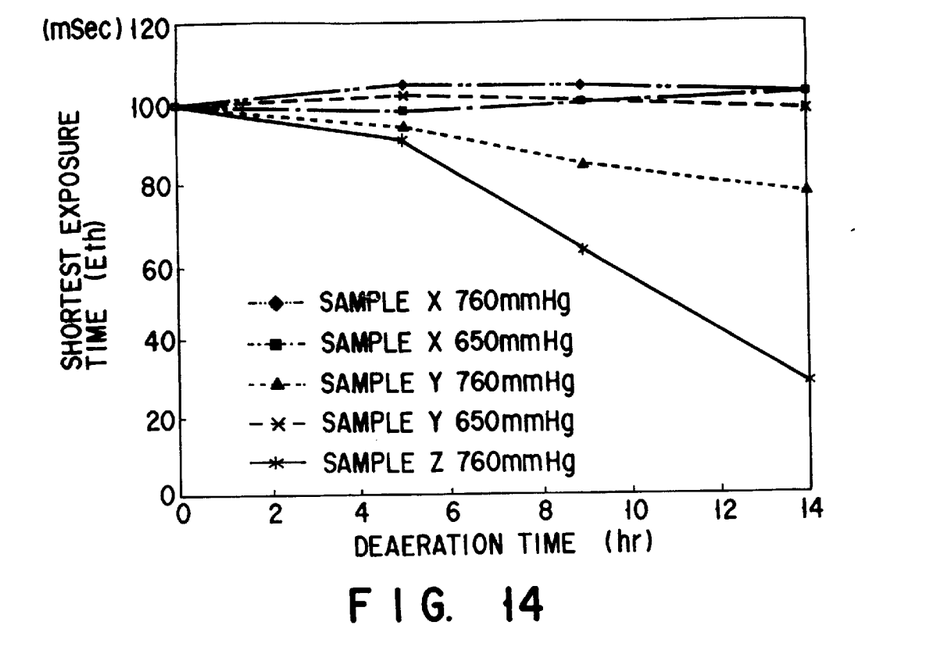
FIG. 14 is a graph showing the relationship between the shortest exposure time and the deaeration time in the processing solution deaeration mechanism used in the developing apparatus of the present invention.

It is desirable to properly select the deaeration conditions of the processing solution deaeration mechanism in the developing method of the present invention in consideration of the reduced pressure, the type of a photoresist, the deaeration time, the concentration of a developing solution, and the like. For example, if deaeration is performed under too high a reduced pressure, the developing solution is boiled at a temperature lower than an environment temperature, thereby evaporating a water to pass the water through an deaeration film. The developing solution is discharged to higher the concentration of the developing solution. That is, as shown in FIG. 12, a developing process is instable under too high a reduced pressure to decrease the line width. In addition, it is found as shown in FIGS. 13 and 14 that the concentration of a developing solution (FIG. 13) and the shortest exposure time (Eth) change in accordance with the type of a photoresist (X, Y, and Z), the deaeration time, and the reduced pressure.

Note that the above embodiment exemplifies the case using a semiconductor wafer as an object, but the object is not limited to this. For example, a liquid crystal display substrate may be used. Various changes and modifications can be made without departing from the spirit and scope of the present invention.

Embodiment 2

Figure 15:
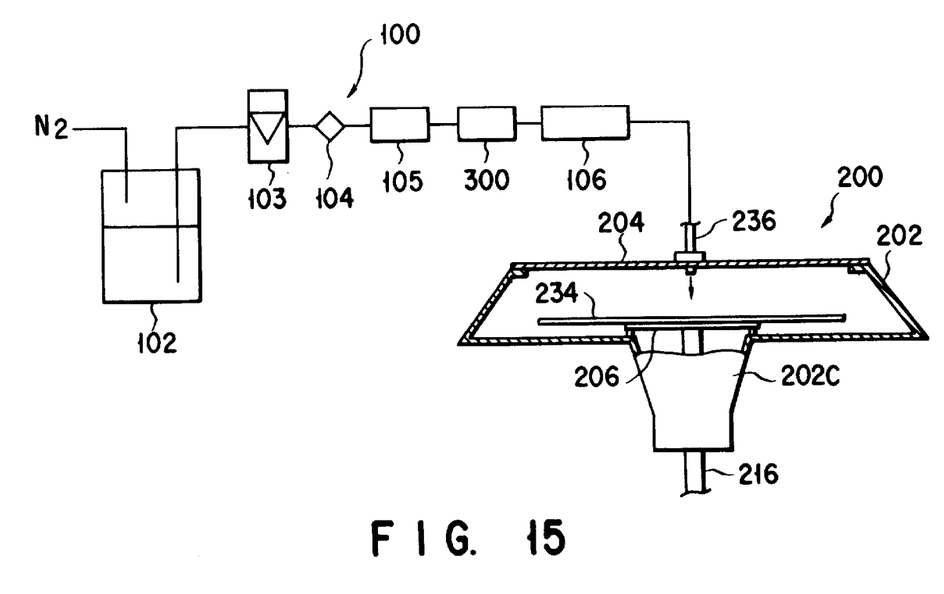
FIGS. 15 and 16 are schematic views each showing another example of the processing solution deaeration mechanism in the developing apparatus of the present invention.

FIG. 15 is a schematic view showing the arrangement of another example of a developing apparatus of the present invention. This developing apparatus is mainly constituted by a developing solution supply system 100, a developing section 200, and a deaeration mechanism 300. As shown in FIG. 15, the developing solution supply system 100 is constituted by a tank 102 for containing a developing solution, a flow meter 103 for measuring the flow rate of the developing solution, a filter 104 for filtering the developing solution, a temperature adjusting device 105 for adjusting the temperature of the developing solution, the deaeration mechanism 300 for removing small bubbles in the developing solution, and a valve 106. The developing solution contained in the tank 102 is extruded by the pressure of nitrogen gas. The developing solution goes through the flow meter 103, the filter 104, and the temperature adjusting device 105, and is deaerated by the deaeration mechanism 300. Then, the developing solution is supplied to the developing section 200 through the valve 106.

Figure 16:
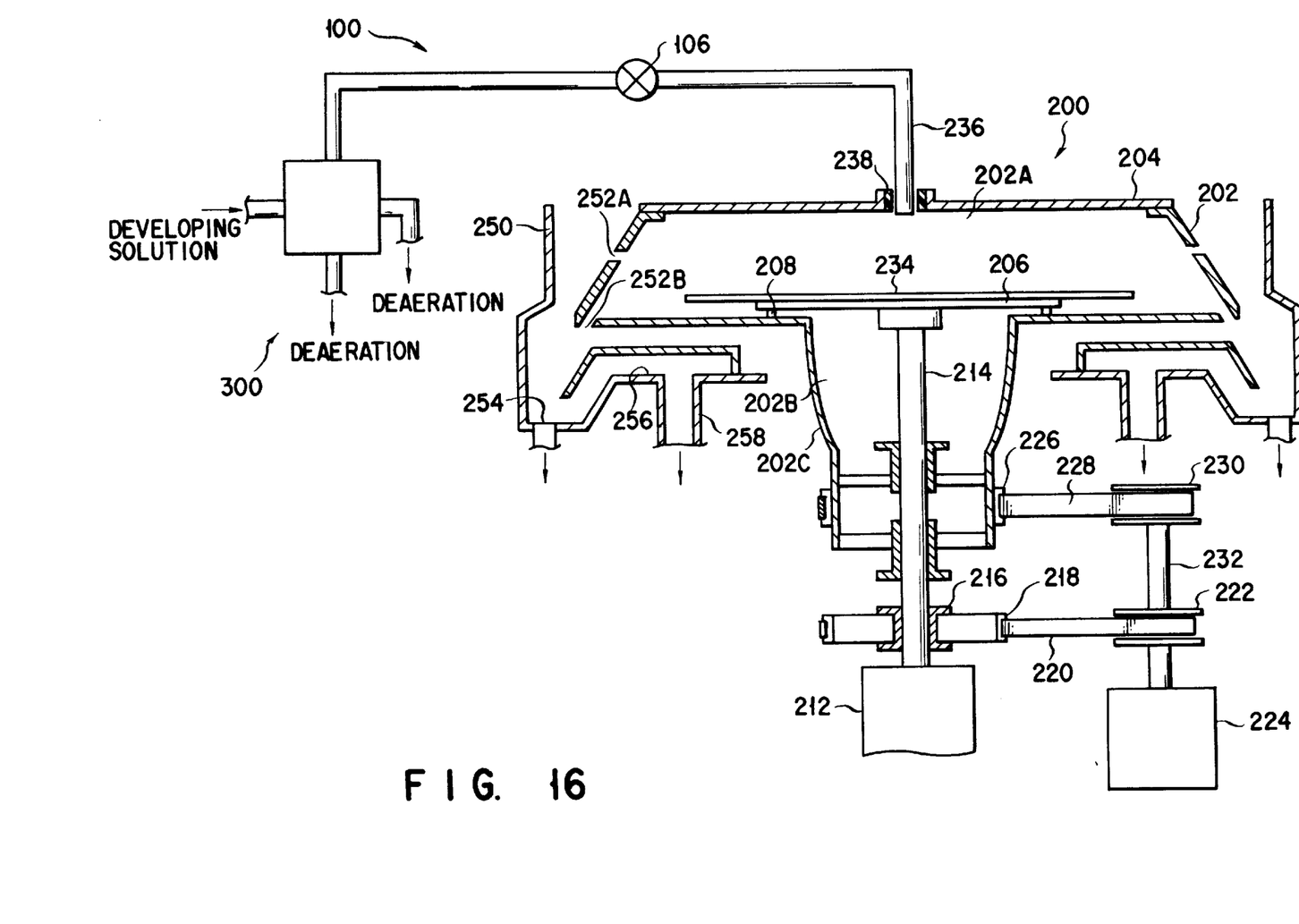

FIG. 16 is a schematic view showing the developing section. In FIG. 16, reference numeral 202 denotes a rotary cup having an open upper surface and rotatable about a vertical shaft. An upper opening portion 202A of the rotary cup 202 has a lid 204 for opening/closing the upper opening portion 202A. An opening portion 202B is formed in the central portion of the bottom surface of the rotary cup 202. The opening edge of the opening portion 202B is connected to the upper edge of a rotary collar 202C for rotating the rotary cup 202. Note that, in Embodiment 2, the rotary cup 202 and the lid 204 constitute a rotary vessel.

A rotary table rotatable about the vertical shaft, e.g., a spin chuck 206 is arranged in the rotary cup 202 such that the lower surface of the peripheral portion of the spin chuck 206 and a seal member 208 such as an O-ring seal the opening portion 202B in the bottom surface of the rotary cup 202. The spin chuck 206 is attached to the top portion of an elevating shaft 214 which is elevated by an elevating mechanism 212 such as an air cylinder. The elevating shaft 214 is connected to a driving pulley 222 through a spline bearing 216, a driven pulley 218, and a driving belt 220. When a rotation driving force is applied to the elevating shaft 214 by a spin motor 224, the spin chuck 206 can be rotated.

Similarly, the rotary collar 202C is connected to a common driving pulley 230 through a driven pulley 226 and a driving belt 228. The driving pulleys 222 and 230 are arranged to a common shaft 232. When a rotation driving force is applied by the common spin motor 224, the spin chuck 206 and the rotary collar 202C (i.e., the rotary vessel including the rotary cup 202) are rotated in synchronism with each other.

The spin chuck 206 comprises a vacuum chuck (not shown) at an upper surface portion and has a function of chucking an object 234, e.g., an LCD substrate (liquid crystal display glass substrate). Note that the vacuum chuck is connected to an external vacuum unit through a vacuum passage (not shown) formed in the elevating shaft 214.

A nozzle 236 for supplying a developing solution is mounted on the central portion of the lid 204 through a bearing 238 so as to rotate about the rotating shaft of the rotary cup 202 relative to the lid 204. Therefore, the developing solution deaerated by the deaeration mechanism 300 to be described later is supplied in a predetermined amount from the nozzle 236 through the valve 106 onto the surface of the object 234 mounted on the spin chuck 206.

A drain cup 250 is fixed to a fixing portion (not shown) and arranged outside the rotary cup 202 so as to surround the rotary cup 202. The drain cup 250 comprises a drain hole 254 for discharging drainage spouting through drainage discharge holes 252A and 252B which are respectively formed in the side portion and the outer edge of the bottom portion of the rotary cup 202, an exhaust path 256 bent inward in the radial direction, and an exhaust port 258 communicating with the exhaust path 256 and connected to an evacuating unit (not shown). The exhaust path 256 is formed to extend at a higher position than the position of the drain hole 254 so as to prevent the drainage from flowing into the exhaust port 258.

Figure 18:
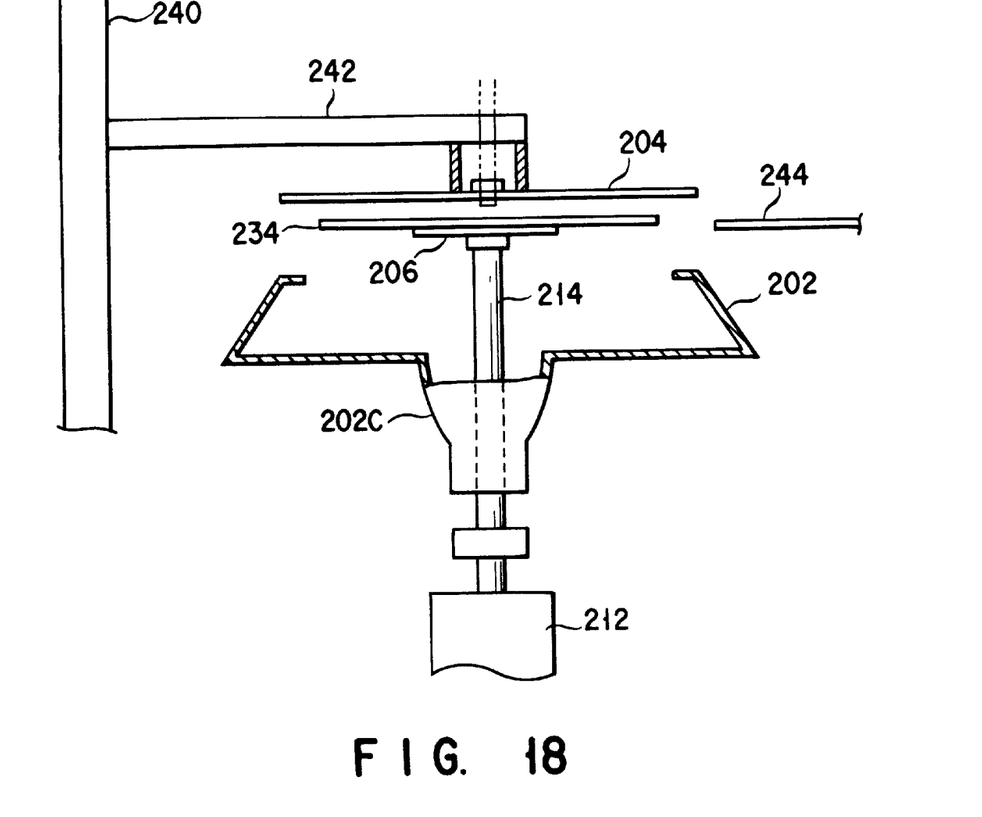
FIG. 18 is a view for explaining the opening/closing operation of a lid and the transfer operation of an object in the developing apparatus of the present invention.

As shown in FIG. 18, the lid 204 is fitted on an arm 242 which is elevated by an elevating portion 240. The upper opening portion 202A of the rotary cup 202 is opened/closed upon elevating the arm 242. Note that an intermediate portion of the nozzle 236 is fixed to, e.g., the arm 242. A convey arm 244 is separately arranged to load/unload the object 234. The object 234 is transferred between the spin chuck 206 and the convey arm 244 as follows. That is, when the lid 204 is moved upward to open the upper opening portion 202A, the spin chuck 206 is moved upward from the upper surface of the rotary cup 202 by the elevating mechanism 212, and the convey arm 244 enters the spin chuck 206 side at a level lower than the lower surface of the object 234 chucked by the spin chuck 206.

Figure 17:
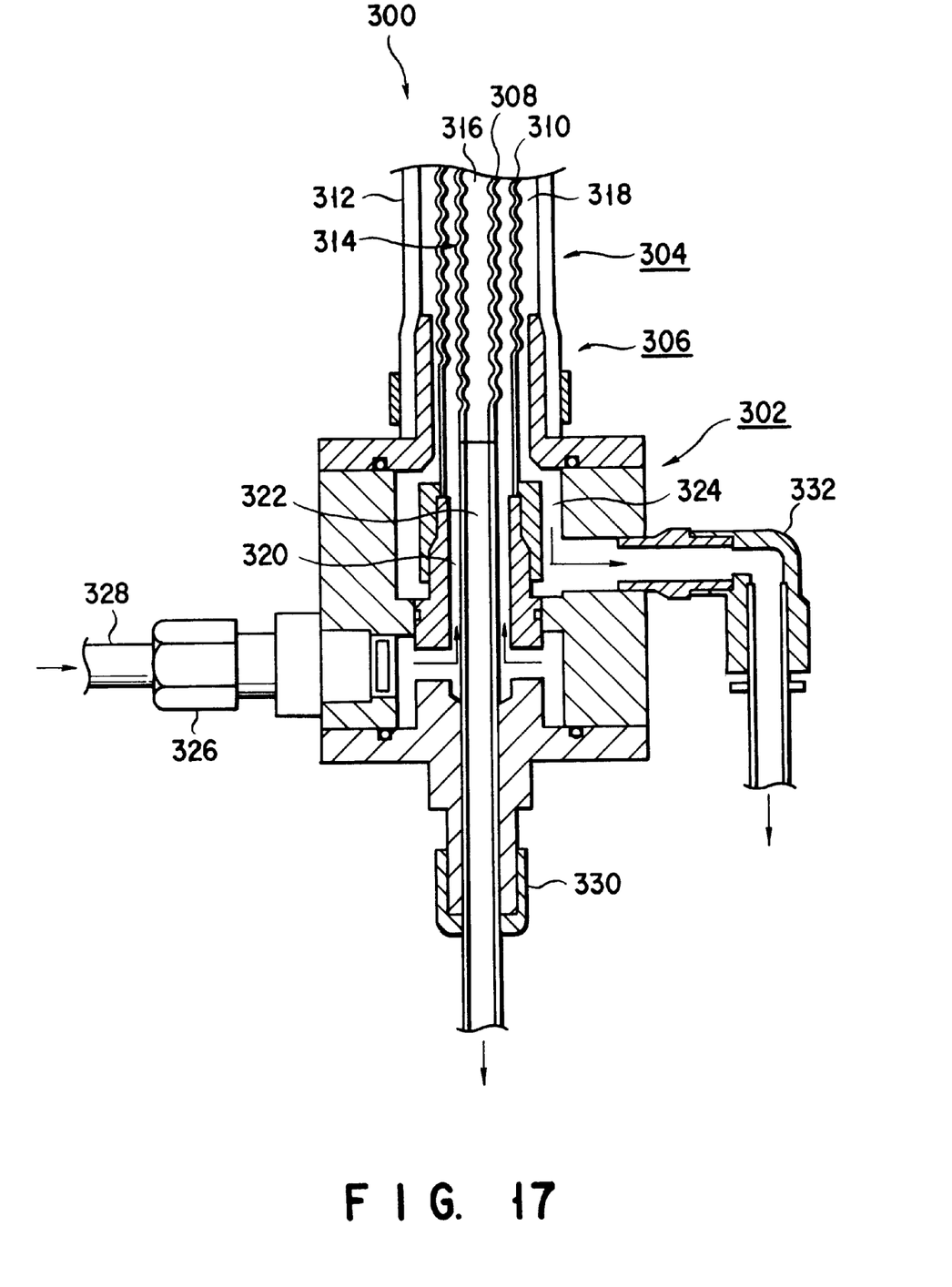
FIG. 17 is an enlarged view showing a portion of the processing solution deaeration mechanism in the developing apparatus of the present invention.

An example of the deaeration mechanism 300 will be described below with reference to FIG. 17. As shown in FIG. 17, the deaeration mechanism 300 is mainly constituted by a manifold portion 302 and a deaeration tube portion 304. The manifold portion 302 and the deaeration tube portion 304 are detachably connected to each other through an engaging portion 306. The deaeration tube in which clogging or the like occurs due to a long period of use can be easily exchanged with new one.

The deaeration tube portion 304 has a flexible triple pipe structure. This triple pipe structure is constituted by a first tube 308 made of a flexible porous material and having the smallest diameter, a second tube 310 having a middle diameter, and a third tube 312 made of a flexible non-porous material and having the largest diameter. Since all the first to third tubes 308, 310, and 312 consist of flexible materials in this manner, the deaeration tube portion 304 can be freely deflected in accordance with the installation location and has a high degree of freedom of design.

The first and second tubes 308 and 310 have bellows-like structures in which the pitches almost correspond to each other. The crests and roots of the respective tubes are positioned to oppose each other. A developing solution flow path 314 is formed between the two tubes. A section, in a substantially horizontal direction, of the developing solution flow path 314 surrounded by the outside of the first tube 308 and the inside of the second tube 310, i.e., a section having the central shaft of the tube as a perpendicular has an area substantially equal to that of a bellows-like portion. With this structure, a developing solution flows smoothly, and disturbance to the flow rate can be prevented to stably supply the developing solution. In Embodiment 2, the bellows-like structure is employed because the surface area of the tube can be increased even with the same-length flow distance to increase the contact area of the developing solution to the first and second tubes 308 and 310. The present invention, however, is not limited to this embodiment, and first and second tubes each having a simple tubular shape may be arranged.

A first hollow deaeration path 316 is formed in the first tube 308. A second tubular deaeration path 318 is formed between the second and third tubes 310 and 312. Each of the first and second tubes 308 and 310 is made of a porous polytetrafluoroethylene tube having an average hole diameter of 0.2 to 0.8 μm. Note that, in Embodiment 2, polytetrafluoroethylene is used as a porous material because a high-precision porous material can be easily obtained from polytetrafluoroethylene by easy rolling and stretching. The material which constitutes the first-and second tubes is not limited to polytetrafluoroethylene, and various commercially available porous materials can be used.

Further, in Embodiment 2, a porous polytetrafluoroethylene tube having an average hole diameter of 0.2 to 0.8 μm is used. If the average hole diameter is too large, the tube easily deforms upon application of a high liquid pressure so as to increase the deaeration efficiency, and sufficient resistance to liquid pressure cannot be obtained. To the contrary, if the average hole diameter is too small, air-permeability is degraded, and sufficient deaeration cannot be performed. Taking these facts into consideration, a preferable average hole diameter is 0.2 to 0.8 μm.

In contrast to this, the third tube 312 arranged at the outermost portion must be flexible but need not pass air (gases). For this reason, the third tube 312 is made of a non-porous material, in which a gas can not be transmitted, having a strength enough to prevent deformation in deaeration, e.g., polyvinyl chloride (PVC), stainless steel (SUS), an acrylic resin, a tetrafluoroethylene-perfluoroalkoxyethylene copolymer (PFA), or the like.

The arrangement of the manifold portion 302 will be described below. As shown in FIG. 17, the manifold portion 302 is constituted by a first path 320 through which a developing solution flows, and second and third paths 322 and 324 constituted independent from each other. A first joint 326 is set on one side portion of the manifold portion 302. The first joint 326 connects the first path 320 to a PFA tube 328 communicating with a developing solution tank (not shown).

A second joint 330 is set below the center of the manifold portion 302. The second joint 330 connects an evacuation means (not shown), e.g., a vacuum suction unit, to the second path 322. The second path 322 communicates with the first deaeration path 316 formed in the first tube 308 of the deaeration tube portion 304. When the interior of the second path 322, i.e., that of the first deaeration path 316 is evacuated, the developing solution flowing through the developing solution flow path 314 formed outside the first tube 308 is deaerated from the inside to remove bubbles in the developing solution.

A third joint 332 is set on the other side of the manifold portion 302. The third joint 332 connects an evacuation means (not shown) to the third path 324. The third path 324 communicates with the second deaeration path 318 formed between the second and third tubes 310 and 312 of the deaeration tube portion 304. When the interior of the third path 324, i.e., that of the second deaeration path 318 is evacuated, the developing solution flowing through the developing solution flow path 314 formed inside the second tube 310 is deaerated from the outside.

In this manner, with the deaeration mechanism in the developing apparatus of the present invention, a processing solution, e.g., a developing solution, flowing through the deaeration tube can be simultaneously deaerated from the inside and outside of the flow path formed in a substantially cylindrical shape. The deaeration efficiency, therefore, can be increased compared to a conventional deaeration mechanism. In Embodiment 2, the developing solution is fed to the deaeration tube portion 304 through the single manifold portion 302, and evacuation is performed from the deaeration tube portion 304. The present invention, however, is not limited to this. For example, a manifold portion for supplying a developing solution and an evacuation manifold portion may be separately constituted, or evacuation may be performed from a plurality of portions. Note that the manifold portion 302 may be arranged on the other end side of the deaeration tube portion 304 shown in FIG. 17 to perform evacuation from both the ends.

The overall operation of the developing apparatus shown in FIG. 15 will be described below. First of all, as shown in FIG. 18, the lid 204 is moved upward from the rotary cup 202 to open it. The spin chuck 206 is moved upward, and the object 234, e.g., an LCD substrate is transferred from the convey arm 244 to the spin chuck 206. The object 234 is vacuum-chucked to the spin chuck 206. The spin chuck 206 is moved downward to bring the spin chuck 206 into tight contact with the bottom surface of the rotary cup 202. In this state, nitrogen gas is supplied to the tank 102, and a developing solution is fed to the developing solution supply system 100 by the gas pressure. The flow rate of the fed developing solution is controlled by the flow meter 103. The developing solution is filtered by the filter 104 and adjusted to an optimum temperature by the temperature adjusting device 105. The resultant developing solution is fed to the deaeration mechanism 300.

Figure 19:
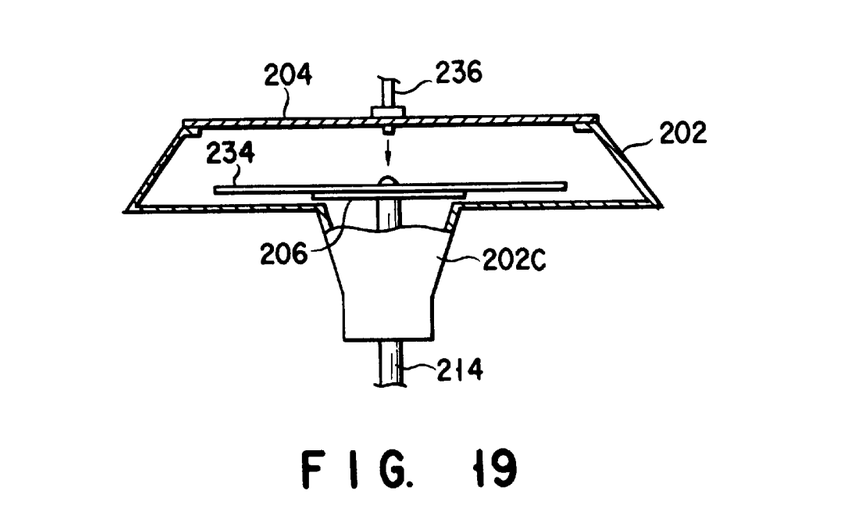
FIG. 19 is a view for explaining the operation of the developing apparatus of the present invention.

In the deaeration mechanism 300, as shown in FIG. 17, the developing solution is efficiently deaerated from the inside and outside of the tube to remove bubbles in the developing solution, while meandering and flowing between the first and second tubes 308 and 310. The developing solution deaerated by the processing solution deaeration mechanism 300 in this manner is dropped in a predetermined amount from the nozzle 236 located above the object 234 onto the central portion of the object through the valve 106 by a supply system such as a spray (see FIG. 19).

Upon driving the motor 224, the rotary collar 202C and the elevating shaft 214 are rotated slowly at the same rotational speed through the belts 220 and 228. As a result, the rotary cup 202 and the spin chuck 206 are rotated at the same rotational speed in synchronism with each other. The developing solution on the object 234 is spread by a centrifugal force to cover the surface of the object 234. With this operation, the object is developed. Then, while the rotary cup 202 and the spin chuck 206 are rotated at a high speed, a rinse solution is supplied, thereby completing the developing process.

During this processing, the residual developing solution blown out by a centrifugal force is discharged into the drain cup 250 through the drainage discharge holes 252A and 252B respectively formed in the side portion and the outer edge of the bottom portion of the rotary cup 202. Further, the developing solution is discharged outside through the drain hole 254 formed in the bottom portion of the drain cup 250.

Note that the structures and shapes of the respective portions in Embodiment 2 described above are merely an example, and various changes and modification can be made. Although the apparatus in which an LCD substrate is coated with a developing solution has been exemplified, the present invention can be applied to an apparatus in which another object such as a semiconductor wafer is coated with various processing solutions such as a coating solution. Further, in the above embodiment, the developing unit 200 has a cup rotating type arrangement in which the rotary cup 202 and the object 234 are rotated simultaneously. The developing unit 200 may have a spinner type arrangement in which the cup is fixed, and the object is rotated.

In this manner, according to Embodiment 2, a processing solution can flow through the space between the tubes of a porous tube having a triple structure, and be simultaneously deaerated from the inside and outside of the deaeration tube. Even with a single tube having a short path, deaeration can be performed with a high efficiency. As a result, the deaeration mechanism can be decreased in size, and the processing uniformity can be realized to improve the yield.

Note that Embodiments 1 and 2 can be properly combined and practiced. In above embodiment, although the apparatus, in which a developing solution is used as a processing solution, has been exemplified, the present invention can be applied to an apparatus in which a resist solution is used as a processing solution. In this case, since a resist solution contains a volatile liquid, a concentration and a viscosity of the resist solution may be controlled by the deaeration process of the present invention.

As has been described above, according to the present invention, a processing solution is deaerated through a member having a gas-liquid separation function, so that only gaseous components in the processing solution can be separated without discharging the processing solution itself. Therefore, there are provided a developing apparatus and developing method in which bubbles in the processing solution can be removed without changing the concentration of the processing solution.

In addition, according to the present invention, a processing solution is passed through a plurality of pipe members each having a gas-liquid separation function. Gaseous components are separated from the processing solution by deaerating the processing solution through the wall portions of the pipe members. With this arrangement, the surface area for removing gaseous components becomes large, and only gaseous components can be more efficiently removed from the processing solution. Therefore, there are provided a developing apparatus and developing method in which bubbles in the processing solution can be removed without changing the concentration of the processing solution, and a developing process can be performed with a high precision without forming small bubbles which will pose a problem in developing a high-resolution resist.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A resist processing apparatus for processing photoresist applied to a substrate by supplying a developer onto the substrate, comprising:

a developer source;

a nozzle means supplied with developer from the developer source, for supplying the developer from a position adjacent to an upper surface of the substrate onto the upper surface of the substrate such that an amount of liquid supplied onto the substrate and an amount of liquid dropping from the substrate are in equilibrium so as to form a liquid film having a thickness on the substrate, thereby obtaining a film of the developer to cover the entire upper surface of the substrate;

developer force sending means communicating with said nozzle means and said developer source, for forcibly introducing pressure-applied gas into the developer source and sending the developer to said nozzle means from said developer source with the pressure-applied gas;

a developer flow path arranged between said developer feeding means and said nozzle means; and a developer deaeration mechanism arranged in said developer flow path to deaerate the developer without changing concentration of the developer, said developer deaeration mechanism comprising:

a sealed vessel;

an inlet port communicating with the developer source, for introducing the developer into the sealed vessel;

a gas-liquid separation member for separating liquid components and dissolved gas components contained in the developer introduced into the sealed vessel, said gas-liquid separation member allowing gas components to pass therethrough, but preventing liquids from passing therethrough, said gas-liquid separation member being one material selected from the group consisting of polytetrafluoroethylene, polyethylene, and polycarbonate;

exhausting means for exhausting, from the sealed vessel, the dissolved gas components separated from the developer by the gas-liquid separation member, and an outlet port for feeding the developer, from which the dissolved gas components are removed by said gas-liquid separation member, to said nozzle means, wherein said nozzle means has:

an inlet communicating with the sealed vessel, a container for temporarily containing the developer fed from the sealed vessel through the inlet, and a substantially linear developer outlet section having a plurality of small outlets each having a section smaller than that of the container, for making streams of the developer which are fed from the small outlets join together to form a continuous liquid curtain between a substrate and itself, said streams of the developer are discharged from said small outlets in a state where said dissolved gas components are not gasified thereby preventing the developer on the substrate from having gas bubbled inside.

2. An apparatus according to claim 1, wherein said developer deaeration mechanism comprises:

a plurality of tubular members arranged to extend from the inlet port to the outlet port in said sealed vessel and each passing the developer therethrough to attain a gas-liquid separation function; and evacuating means for evacuating an interior of said closed vessel to deaerate the developer flowing through said plurality of tubular members through wall portions of said plurality of tubular members, thereby separating gaseous components from the developer.

3. An apparatus according to claim 2, wherein said plurality of tubular members have an inner diameter of not more than 1 mm.

4. An apparatus according to claim 2, wherein the number of said plurality of tubular members is not less than 100.

5. An apparatus according to claim 1, wherein said developer deaeration mechanism comprises:

a tubular member which is arranged to extend from the inlet port to the outlet port in said sealed vessel, and passes the developer therethrough to attain a gas-liquid separation function, said tubular member having a plurality of projecting portions formed along a tube axis direction; and evacuating means for evacuating an interior of said closed vessel to deaerate the developer flowing through said tubular member through a wall portion of said tubular member, thereby separating gaseous components from the developer.

6. An apparatus according to claim 5, wherein said tubular member comprises a porous member.

7. An apparatus according to claim 1, wherein said developer deaeration mechanism comprises:

a first tube having a first diameter and made of a porous material;

a second tube having a second diameter larger than the first diameter and made of a porous material;

a third tube having a third diameter larger than the second diameter and made of a non-porous material;

inner evacuating means arranged inside said first tube; and outer evacuating means arranged between said second and third tubes, wherein the developer flows through a path formed between said first and second tubes.

8. An apparatus according to claim 7, wherein said porous material has an average hole diameter of 0.2 to 0.8 μm.

9. An apparatus according to claim 7, wherein said porous material is one of polytetrafluoroethylene and a methylpentene resin.

10. An apparatus according to claim 7, wherein said non-porous material is one material selected from the group consisting of polytetrafluoroethylene, polyvinyl chloride, stainless steel, an acrylic resin, and a tetrafluoroethylene-perfluoroalkoxyethylene copolymer.

11. A resist processing apparatus according to claim 1, further comprising a spin chuck for supporting and rotating the substrate.

12. A resist processing apparatus for processing photoresist applied to a substrate by supplying a developer onto the substrate, comprising:

a developer source;

a nozzle means supplied with developer from the developer source, for supplying the developer from a position adjacent to an upper surface of the substrate onto the upper surface of the substrate such that an amount of liquid supplied onto the substrate and an amount of liquid dropping from the substrate are in equilibrium so as to form a liquid film having a thickness on the substrate, thereby obtaining a film of the developer to cover the entire upper surface of the substrate;

developer force sending means communicating with said nozzle means and said developer source, for forcibly introducing pressure-applied gas into the developer source and sending the developer to said nozzle means from said developer source by the pressure-applied gas;

a developer flow path arranged between said developer feeding means and said nozzle means;

a developer flow controller arranged in said developer flow path to control a flow rate of the developer; and a developer deaeration mechanism arranged in said developer flow path to deaerate the developer without changing concentration of the developer, said developer deaeration mechanism comprising:

a sealed vessel;

an inlet port communicating with the developer source, for introducing the developer into the sealed vessel;

a gas-liquid separation member for separating liquid components and dissolved gas components contained in the developer introduced into the sealed vessel;

exhausting means for exhausting, from the sealed vessel, the dissolved gas components separated from the developer by the gas-liquid separation member; and an outlet port for feeding the developer, from which the dissolved gas components are removed by said gas-liquid separation member, to said nozzle means, wherein said nozzle means has:

an inlet communicating with the sealed vessel, a container for temporarily containing the developer fed from the sealed vessel through the inlet, and a substantially linear developer outlet section having a plurality of small outlets each having a section smaller than that of the container, for making streams of the developer which are fed from the small outlets join together to form a continuous liquid curtain between a substrate and itself, said streams of the developer are discharged from said small outlets in a state where said dissolved gas components are not gasified thereby preventing the developer on the substrate from having gas bubbles inside.

* * * * *